(12) United States Patent
Soeta et al.

(10) Patent No.: US 12,431,603 B2
(45) Date of Patent: Sep. 30, 2025

(54) MULTILAYER SUBSTRATE AND MANUFACTURING METHOD THEREFOR

(71) Applicant: Murata Manufacturing Co., Ltd., Nagaokakyo (JP)

(72) Inventors: Yushi Soeta, Nagaokakyo (JP); Kentarou Kawabe, Nagaokakyo (JP); Kouki Shimizu, Nagaokakyo (JP); Toru Kurisu, Nagaokakyo (JP); Akihiro Yamakawa, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 225 days.

(21) Appl. No.: 18/207,169

(22) Filed: Jun. 8, 2023

(65) Prior Publication Data

US 2023/0318160 A1 Oct. 5, 2023

Related U.S. Application Data

(63) Continuation of application No. PCT/JP2021/046177, filed on Dec. 15, 2021.

(30) Foreign Application Priority Data

Dec. 24, 2020 (JP) ................. 2020-214600

(51) Int. Cl.
*H01P 3/08* (2006.01)
*H01P 1/203* (2006.01)
(Continued)

(52) U.S. Cl.
CPC .......... *H01P 3/088* (2013.01); *H01P 1/20345* (2013.01); *H01P 3/082* (2013.01);
(Continued)

(58) Field of Classification Search
CPC ............ H05K 1/05; H05K 2201/09736; H01P 1/20345; H01P 3/088; H03H 2001/0085
(Continued)

(56) References Cited

U.S. PATENT DOCUMENTS

2017/0297302 A1 10/2017 Okimura et al.
2022/0053636 A1* 2/2022 Matsuda ............... H05K 1/116

FOREIGN PATENT DOCUMENTS

JP 02109390 A 4/1990
JP 09199816 A 7/1997
(Continued)

OTHER PUBLICATIONS

International Search Report in PCT/JP2021/046177, mailed Mar. 15, 2022, 3 pages.
(Continued)

*Primary Examiner* — Rakesh B Patel
(74) *Attorney, Agent, or Firm* — Keating & Bennett, LLP

(57) ABSTRACT

A multilayer body has a structure including insulating layers stacked on each other in an up-down direction. A first conductive layer is on a top main surface of one of the insulating layers. A first signal is transmitted through the first conductive layer. A second conductive layer is on a same insulating layer that the first conductive layer is on. The second conductive layer is on a same main surface as the top main surface or the bottom main surface of the insulating layer on which the first conductive layer is located. A second signal having a higher frequency than the first signal is transmitted through the second conductive layer. A top conductive layer is above the second conductive layer. A thickness of the second conductive layer in the up-down direction is smaller than that of the first conductive layer in the up-down direction.

20 Claims, 15 Drawing Sheets

(51) Int. Cl.
    *H05K 1/05* (2006.01)
    *H05K 1/09* (2006.01)
    *H05K 3/46* (2006.01)
(52) U.S. Cl.
    CPC ................ *H05K 1/05* (2013.01); *H05K 1/09* (2013.01); *H05K 3/4644* (2013.01)
(58) Field of Classification Search
    USPC ........................................ 333/185, 202–205
    See application file for complete search history.

(56) References Cited

FOREIGN PATENT DOCUMENTS

| | | |
|---|---|---|
| JP | H11282592 A | 10/1999 |
| JP | 2003133660 A | 5/2003 |
| JP | 2020164870 A | 10/2020 |

OTHER PUBLICATIONS

Written Opinion in PCT/JP2021/046177, mailed Mar. 15, 2022, 5 pages.

* cited by examiner

Fig.2
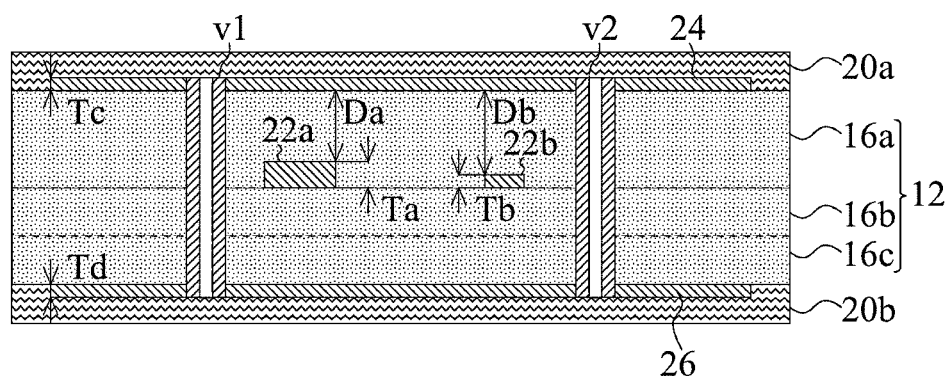
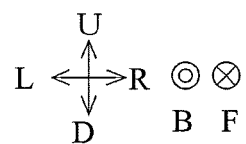

Fig.3
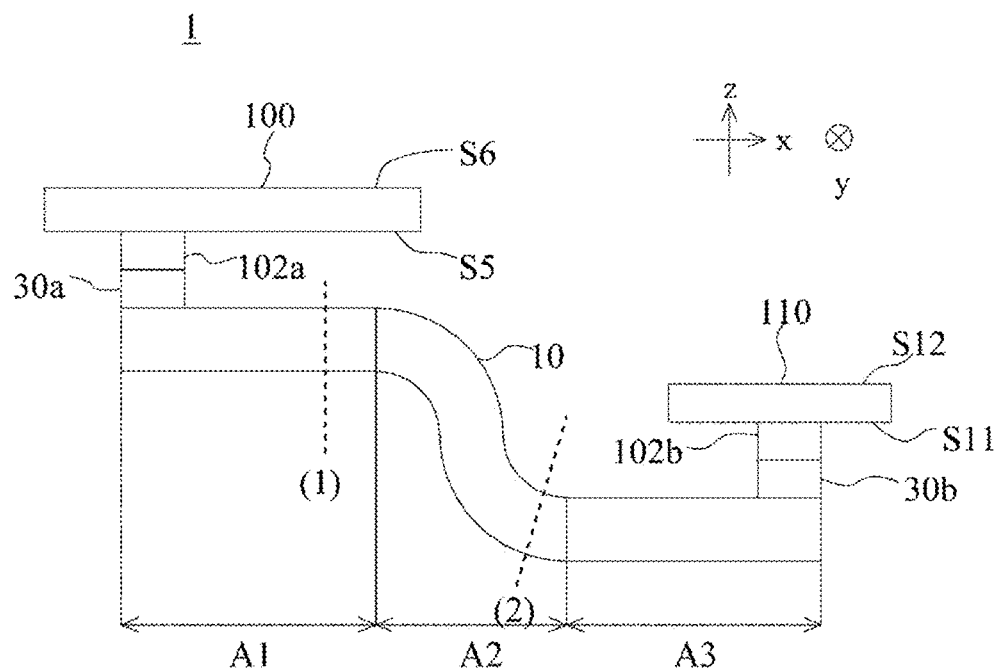
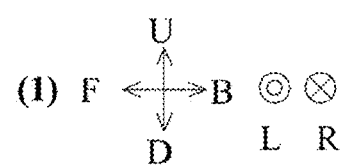
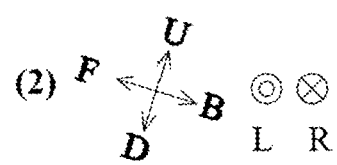

Fig.10
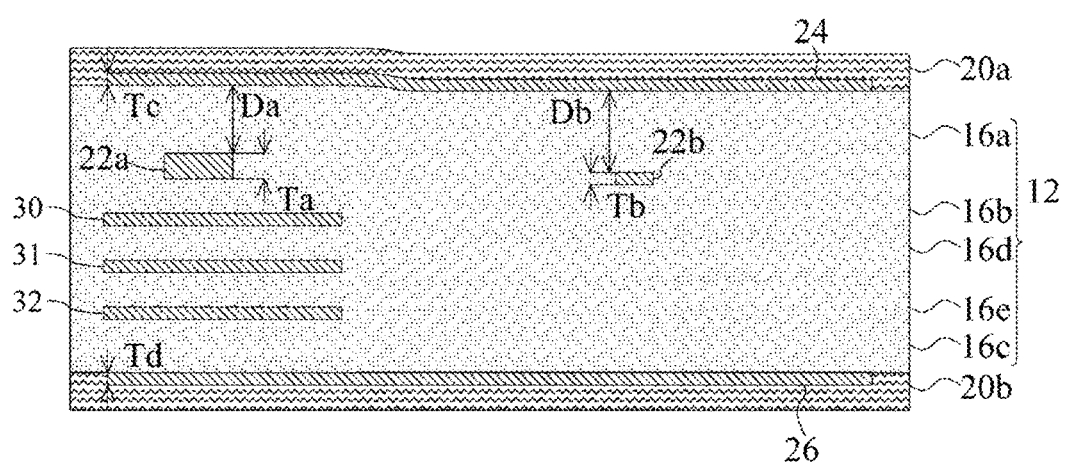
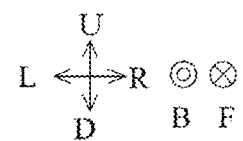

Fig.11
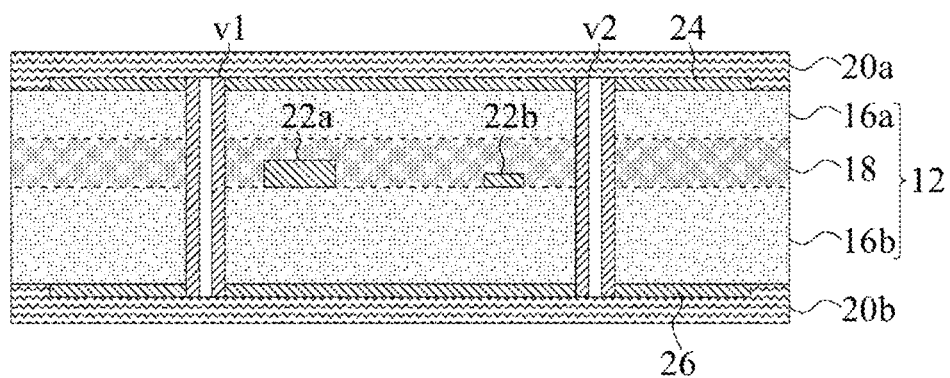
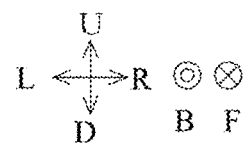

PREPARATION STEP

Fig.14
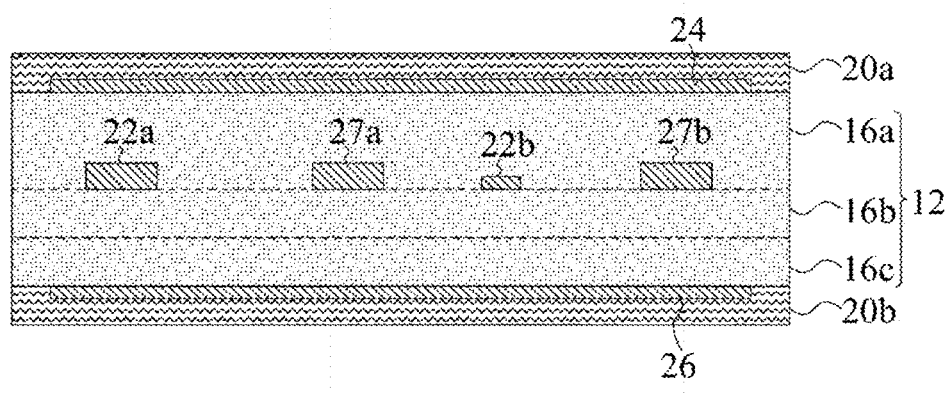
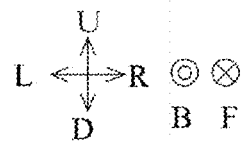

Fig.15
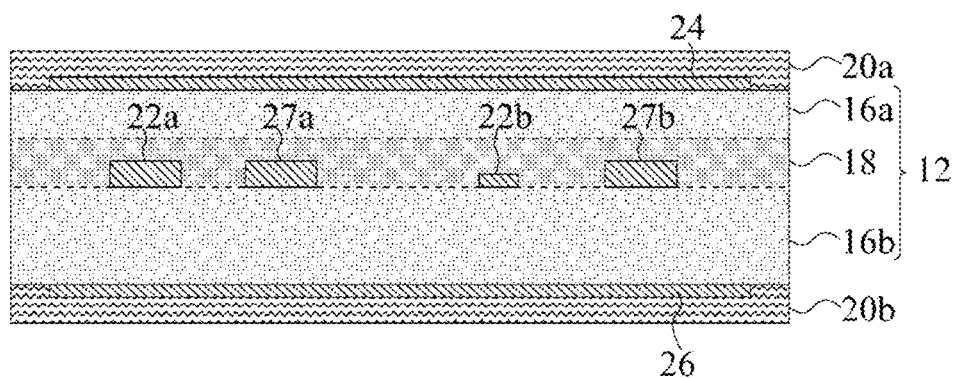
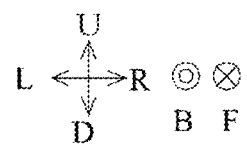

MULTILAYER SUBSTRATE AND MANUFACTURING METHOD THEREFOR

CROSS REFERENCE TO RELATED APPLICATIONS

This application claims the benefit of priority to Japanese Patent Application No. 2020-214600 filed on Dec. 24, 2020 and is a Continuation Application of PCT Application No. PCT/JP2021/046177 filed on Dec. 15, 2021. The entire contents of each application are hereby incorporated herein by reference.

BACKGROUND OF THE INVENTION

1. Field of the Invention

The present invention relates to a multilayer substrate including multiple insulating layers stacked on each other and relates to a method of manufacturing a multilayer substrate.

2. Description of the Related Art

As an invention of a multilayer substrate of the related art, a differential signal transmission line disclosed in Japanese Unexamined Patent Application Publication No. H11-282592, for example, is known. This differential signal transmission line includes multiple flexible insulating sheets, a first transmission line layer, a second transmission line layer, a first ground line layer, and a second ground line layer. The multiple flexible insulating sheets are stacked on each other in the up-down direction. A signal is transmitted through the first transmission line layer, while a signal having a different frequency is transmitted through the second transmission line layer. The first ground line layer is disposed above the first and second transmission line layers. The second ground line layer is disposed below the first and second transmission line layers. In this manner, in the differential signal transmission line, a stripline structure is constructed.

It is desirable for the differential signal transmission line disclosed in Japanese Unexamined Patent Application Publication No. H11-282592 to reduce transmission loss occurring in the first and second transmission line layers through which signals having different frequencies are transmitted.

SUMMARY OF THE INVENTION

Preferred embodiments of the present invention provide multilayer substrates and manufacturing methods therefor that each reduce transmission loss occurring in a first conductive layer through which a signal is transmitted and that in a second conductive layer through which a signal having a different frequency is transmitted.

A multilayer substrate according to a preferred embodiment of the present invention includes a multilayer body, a first conductive layer, a second conductive layer, and a top conductive layer. The multilayer body includes a plurality of insulating layers stacked on each other in an up-down direction. The first conductive layer is on one of a top main surface and a bottom main surface of one of the insulating layers. A first signal is transmitted through the first conductive layer. The second conductive layer is on the same insulating layer as the insulating layer on which the first conductive layer is provided. The second conductive layer is on the one of the top main surface and the bottom main surface of the insulating layer, on which the first conductive layer is provided. A second signal having a higher frequency than the first signal is transmitted through the second conductive layer. The top conductive layer is provided on the multilayer body above the first and second conductive layers so as to overlap the second conductive layer as viewed in the up-down direction. The thickness of the second conductive layer in the up-down direction is smaller than that of the first conductive layer in the up-down direction.

A manufacturing method for a multilayer substrate according to a preferred embodiment of the present invention includes preparing a third insulating layer including a first conductive layer and a second conductive layer on one of a top main surface and a bottom main surface of the third insulating layer, a thickness of the first conductive layer in an up-down direction being different from a thickness of the second conductive layer in the up-down direction, and performing heating processing and pressurizing processing on a plurality of insulating layers including the third insulating layer after the plurality of insulating layers including the third insulating layer are stacked on each other in the up-down direction. A material for the plurality of insulating layers includes a thermoplastic resin.

A multilayer substrate according to a preferred embodiment of the present invention includes a multilayer body, a first conductive layer, a second conductive layer, and a top conductive layer. The multilayer body includes a plurality of insulating layers stacked on each other in an up-down direction. The first conductive layer is on one of the plurality of insulating layers. A first signal is transmitted through the first conductive layer. The second conductive layer is on one of the plurality of insulating layers. A second signal having a higher frequency than the first signal is transmitted through the second conductive layer. The top conductive layer is on the multilayer body above the first and second conductive layers so as to overlap the second conductive layer as viewed in the up-down direction. The second conductive layer overlaps the first conductive layer in a direction perpendicular or substantially perpendicular to a transmitting direction of the first signal. The thickness of the second conductive layer in the up-down direction is smaller than the thickness of the first conductive layer in the up-down direction.

A manufacturing method for a multilayer substrate according to a preferred embodiment of the present invention includes preparing a third insulating layer including a first conductive layer and a second conductive layer on one of a top main surface and a bottom main surface of the third insulating layer, a thickness of the first conductive layer in an up-down direction being different from a thickness of the second conductive layer in the up-down direction, and performing heating processing and pressurizing processing on a first insulating layer, a second insulating layer, and the third insulating layer, the second insulating layer being a bonding layer without a conductive layer, after the first insulating layer, the second insulating layer, and the third insulating layer are stacked on each other from an upward to downward direction in order of the first insulating layer, the second insulating layer, and the third insulating layer.

Multilayer substrates and manufacturing methods therefor according to preferred embodiments of the present invention reduce transmission loss occurring in a first conductive layer through which a signal is transmitted and that in a second conductive layer through which a signal having a different frequency is transmitted.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 2 is a sectional view of the multilayer substrate 10 taken along line A-A in FIG. 1.

FIG. 3 is a left side view of an electronic device 1 including the multilayer substrate 10 according to a preferred embodiment of the present invention.

FIG. 10 is a sectional view of a multilayer substrate 10b according to a modified example of a preferred embodiment of the present invention.

FIG. 11 is a sectional view of a multilayer substrate 10c according to a modified example of a preferred embodiment of the present invention.

FIG. 14 is a sectional view of a multilayer substrate 10d according to a modified example of a preferred embodiment of the present invention.

FIG. 15 is a sectional view of a multilayer substrate 10e according to a modified example of a preferred embodiment of the present invention.

DETAILED DESCRIPTION OF THE PREFERRED EMBODIMENTS

Preferred Embodiment

Structure of Multilayer Substrate 10

Figure 1:
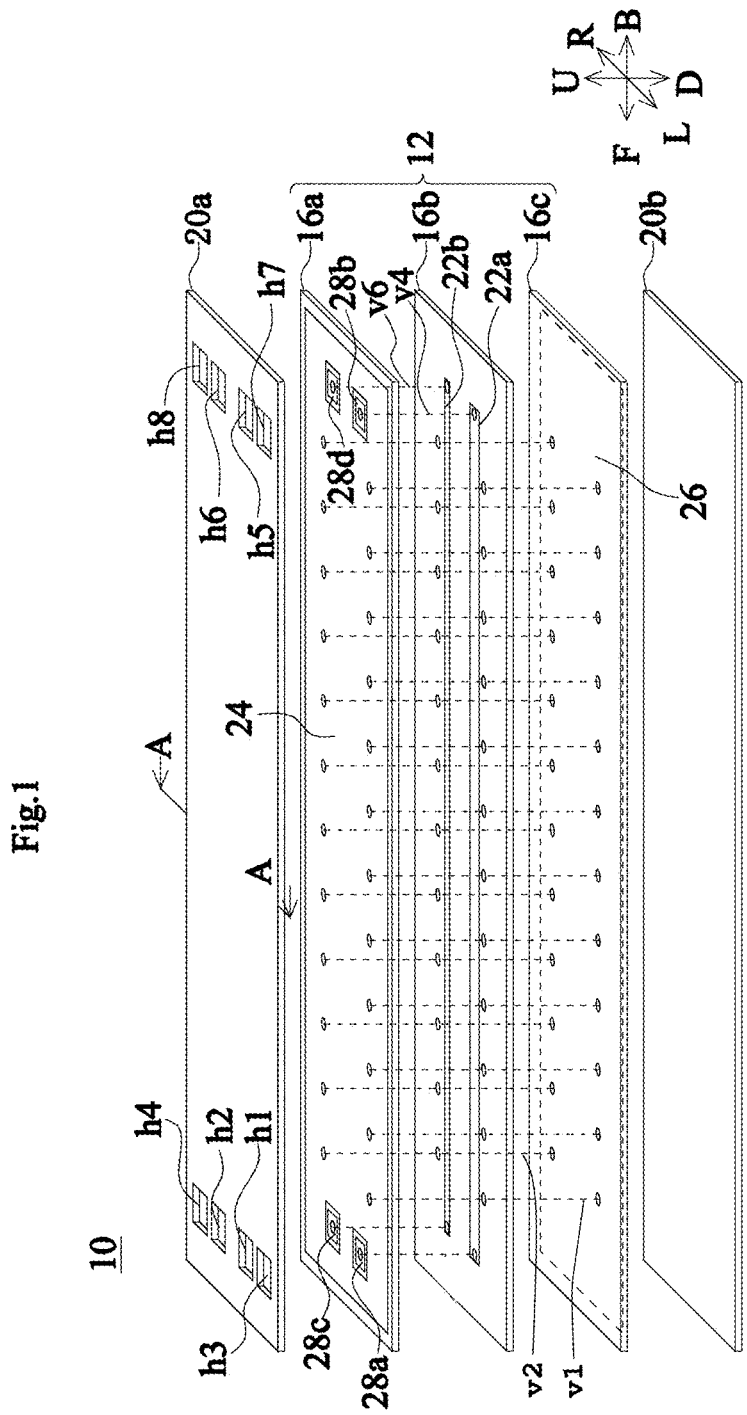
FIG. 1 is an exploded perspective view of a multilayer substrate 10 according to a preferred embodiment of the present invention.

The structure of a multilayer substrate 10 according to a preferred embodiment of the present invention will be described below with reference to the drawings. FIG. 1 is an exploded perspective view of the multilayer substrate 10. In FIG. 1, among multiple interlayer connecting conductors v1 and v2, only representative interlayer connecting conductors v1 and v2 are designated by reference signs. FIG. 2 is a sectional view of the multilayer substrate 10 taken along line A-A in FIG. 1.

In the specification, directions are defined as follows. The stacking direction of layers of a multilayer body 12 of the multilayer substrate 10 is defined as an up-down direction. The extending direction of a first conductive layer 22a of the multilayer substrate 10 is defined as a front-back direction. The widthwise direction of the first conductive layer 22a is defined as a left-right direction. The up-down direction, the front-back direction, and the left-right direction are perpendicular or substantially perpendicular to each other.

In the following description, X is a component or a member of the multilayer substrate 10. In the specification, the individual portions of X are defined as follows and are used as such unless otherwise stated. A front portion of X means a front half of X. A back portion of X means a back half of X. A left portion of X means a left half of X. A right portion of X means a right half of X. A top portion of X means a top half of X. A bottom portion of X means a bottom half of X. A front end of X means the end of X in the front direction. A back end of X means the end of X in the back direction. A left end of X means the end of X in the left direction. A right end of X means the end of X in the right direction. A top end of X means the end of X in the up direction. A bottom end of X means the end of X in the down direction. A front end portion of X means the front end of X and the vicinity thereof. A back end portion of X means the back end of X and the vicinity thereof. A left end portion of X means the left end of X and the vicinity thereof. A right end portion of X means the right end of X and the vicinity thereof. A top end portion of X means the top end of X and the vicinity thereof. A bottom end portion of X means the bottom end of X and the vicinity thereof.

The structure of the multilayer substrate 10 will first be described below with reference to FIG. 1. A signal is transmitted through the multilayer substrate 10. The multilayer substrate 10 is used in an electronic device, such as a smartphone, for example, to electrically connect two circuits. As illustrated in FIG. 1, the multilayer substrate 10 includes the multilayer body 12, protection layers 20a and 20b, a first conductive layer 22a, a second conductive layer 22b, a top conductive layer 24, a bottom conductive layer 26, signal terminals 28a through 28d, plural interlayer connecting conductors v1, plural interlayer connecting conductors v2, and interlayer connecting conductors v3 through v6.

The multilayer body 12 has a planar shape. The multilayer body 12 thus includes a top main surface and a bottom main surface. The top main surface and the bottom main surface of the multilayer body 12 each have a normal line extending in the up-down direction. The top main surface and the bottom main surface of the multilayer body 12 each have a rectangular or substantially rectangular shape including long sides extending in the front-back direction. Accordingly, the length of the multilayer body 12 in the front-back direction is longer than that of the multilayer body 12 in the left-right direction.

As illustrated in FIG. 1, the multilayer body 12 includes insulating layers 16a through 16c. The multilayer body 12 has a structure in which the insulating layers 16a through 16c are stacked on each other in the up-down direction. The insulating layers 16a through 16c are arranged in the downward direction in this order. As viewed in the up-down direction, the insulating layers 16a through 16c have a rectangular or substantially rectangular shape the same or substantially the same as that of the multilayer body 12. The insulating layers 16a through 16c are dielectric sheets having flexibility. The material for the insulating layers 16a through 16c include a thermoplastic resin. Examples of the thermoplastic resin are liquid crystal polymer and PTFE (polytetrafluoroethylene). The material for the insulating layers 16a through 16c may be, for example, polyimide. In this manner, the multilayer body 12 is a main body made of an insulating material.

The first conductive layer 22a is provided in the multilayer body 12 (main body). The first conductive layer 22a is provided for the insulating layer 16b among the plural insulating layers. The first conductive layer 22a is disposed on the top main surface or the bottom main surface of the insulating layer 16b. In the present preferred embodiment, the first conductive layer 22a is disposed on the top main surface of the insulating layer 16b. The first conductive layer 22a has a linear shape and extends in the front-back direction. A first signal is transmitted through the first conductive layer 22a. The first signal is a signal having a frequency of zero to several tens of megahertz, for example. The first signal is a DC signal defining and functioning as a power supply, for example. The first signal is a radio-frequency signal of about 13.56 MHz, for example.

The second conductive layer 22b is provided in the multilayer body 12 (main body). The second conductive layer 22b is provided for the insulating layer 16b among the plural insulating layers. The second conductive layer 22b is disposed on the same main surface of the insulating layer 16b as that of the insulating layer 16b on which the first conductive layer 22a is disposed. Accordingly, the position of the second conductive layer 22b in the up-down direction is the same as that of the first conductive layer 22a. In the present preferred embodiment, the second conductive layer 22b is disposed on the top main surface of the insulating layer 16b. In a direction (left-right direction) perpendicular to the direction (front-back direction) in which the first signal is transmitted, the second conductive layer 22b overlaps the first conductive layer 22a. The second conductive layer 22b has a linear shape and extends in the front-back direction. The second conductive layer 22b is disposed on the right side of the first conductive layer 22a. A second signal having a higher frequency than the first signal is transmitted through the second conductive layer 22b. The second signal is a radio-frequency signal having a frequency of about 100 MHz or higher, for example.

The top conductive layer 24 is provided on the multilayer body 12 (main body). As viewed in the up-down direction, the top conductive layer 24 is disposed above the first conductive layer 22a and the second conductive layer 22b so as to overlap the second conductive layer 22b. In the present preferred embodiment, the top conductive layer 24 is provided on the multilayer body 12. As viewed in the up-down direction, the top conductive layer 24 is disposed above the first conductive layer 22a and the second conductive layer 22b so as to overlap them. In the present preferred embodiment, the top conductive layer 24 is disposed on the top main surface of the insulating layer 16a. The top conductive layer 24 covers the entirety of substantially the entirety of the top main surface of the insulating layer 16a. The top conductive layer 24 is connected to a ground potential. Thus, the top conductive layer 24 is a ground conductive layer.

The bottom conductive layer 26 is provided on the multilayer body 12 (main body). As viewed in the up-down direction, the bottom conductive layer 26 is disposed below the first conductive layer 22a and the second conductive layer 22b so as to overlap the second conductive layer 22b. In the present preferred embodiment, the bottom conductive layer 26 is provided on the multilayer body 12. As viewed in the up-down direction, the bottom conductive layer 26 is disposed below the first conductive layer 22a and the second conductive layer 22b so as to overlap them. In the present preferred embodiment, the bottom conductive layer 26 is disposed on the bottom main surface of the insulating layer 16c. In the present preferred embodiment, the bottom conductive layer 26 covers the entirety of substantially the entirety of the bottom main surface of the insulating layer 16c. The bottom conductive layer 26 is connected to a ground potential. Thus, the bottom conductive layer 26 is a ground conductive layer. With the above-described arrangement, the first conductive layer 22a, second conductive layer 22b, top conductive layer 24, and bottom conductive layer 26 define a stripline structure.

As illustrated in FIG. 2, the thickness Tb of the second conductive layer 22b in the up-down direction is smaller than the thickness Ta of the first conductive layer 22a in the up-down direction. The thickness Ta is about 17 µm to about 35 µm, for example. The thickness Tb is about 6 µm to about 12 µm, for example. The thickness Tb of the second conductive layer 22b in the up-down direction is the same or substantially the same as the thickness Tc of the top conductive layer 24 in the up-down direction and the thickness Td of the bottom conductive layer 26 in the up-down direction. That is, the thickness Ta of the first conductive layer 22a in the up-down direction is larger than the thickness Tc of the top conductive layer 24 in the up-down direction and the thickness Td of the bottom conductive layer 26 in the up-down direction. Since the first conductive layer 22a and the second conductive layer 22b have the above-described structure, the distance Da between the first conductive layer 22a and the top conductive layer 24 in the up-down direction is smaller than the distance Db between the second conductive layer 22b and the top conductive layer 24 in the up-down direction.

The plural interlayer connecting conductors v1 and v2 electrically connect the top conductive layer 24 and the bottom conductive layer 26. More specifically, the interlayer connecting conductors v1 and v2 pass through the insulating layers 16a through 16c in the up-down direction. The top ends of the plural interlayer connecting conductors v1 and v2 are connected to the top conductive layer 24. The bottom ends of the plural interlayer connecting conductors v1 and v2 are connected to the bottom conductive layer 26. The plural interlayer connecting conductors v1 are arranged on the left side of the first conductive layer 22a and are aligned at equal spacings in the front-back direction. The plural interlayer connecting conductors v2 are arranged on the right side of the second conductive layer 22b and are aligned at equal spacings in the front-back direction.

The signal terminals 28a and 28c are disposed at the front end portion of the top main surface of the insulating layer 16a. The signal terminals 28a and 28c each have a rectangular or substantially rectangular shape as viewed in the up-down direction. The signal terminal 28a overlaps the front end portion of the first conductive layer 22a as viewed in the up-down direction. The signal terminal 28c overlaps the front end portion of the second conductive layer 22b as viewed in the up-down direction. The top conductive layer 24 is not provided around the signal terminals 28a and 28c so that the signal terminals 28a and 28c are insulated from the top conductive layer 24.

The interlayer connecting conductor v3 electrically connects the signal terminal 28a and the first conductive layer 22a. More specifically, the interlayer connecting conductor v3 passes through the insulating layer 16a in the up-down direction. The top end of the interlayer connecting conductor v3 is connected to the signal terminal 28a. The bottom end of the interlayer connecting conductor v3 is connected to the front end portion of the first conductive layer 22a. With this configuration, the signal terminal 28a is electrically connected to the first conductive layer 22a. The first signal is input into and output from the first conductive layer 22a via the signal terminal 28a.

The interlayer connecting conductor v5 electrically connects the signal terminal 28c and the second conductive layer 22b. More specifically, the interlayer connecting conductor v5 passes through the insulating layer 16a in the up-down direction. The top end of the interlayer connecting conductor v5 is connected to the signal terminal 28c. The bottom end of the interlayer connecting conductor v5 is connected to the front end portion of the second conductive layer 22b. With this configuration, the signal terminal 28c is electrically connected to the second conductive layer 22b. The second signal is input into and output from the second conductive layer 22b via the signal terminal 28c.

The structure of the signal terminals 28b and 28d and the interlayer connecting conductors v4 and v6 is symmetrical to that of the signal terminals 28a and 28c and the interlayer connecting conductors v3 and v5 with respect to the front-back direction. An explanation of the signal terminals 28b and 28d and the interlayer connecting conductors v4 and v6 will thus be omitted.

The first conductive layer 22a, second conductive layer 22b, top conductive layer 24, bottom conductive layer 26, and signal terminals 28a through 28d are formed by, for example, etching on a conductive foil provided on the top main surface or the bottom main surface of the insulating layers 16a through 16c. The conductive foil is a copper foil, for example. The interlayer connecting conductors v1 through v6 are through-hole conductors, for example. The through-hole conductors are formed, for example, by making through-holes in the insulating layers 16a through 16c and by plating the through-holes. The interlayer connecting conductors v1 through v6 may be via-hole conductors. The via-hole conductors are formed by, for example, making through-holes in the insulating layers 16a through 16c, filling a conductive paste into the through-holes, and by sintering the conductive paste.

The protection layers 20a and 20b are insulating layers having flexibility. The protection layers 20a and 20b are not a portion of the multilayer body 12. The protection layers 20a and 20b have a rectangular or substantially rectangular shape the same or substantially the same as that of the multilayer body 12 as viewed in the up-down direction.

The protection layer 20a covers the entirety or substantially the entirety of the top main surface of the insulating layer 16a so as to protect the top conductive layer 24. Cavities h1 through h8 are provided in the protection layer 20a. The cavity h1 overlaps the signal terminal 28a as viewed in the up-down direction. This exposes the signal terminal 28a to the outside of the multilayer substrate 10 via the cavity h1. The cavity h2 overlaps the signal terminal 28c as viewed in the up-down direction. This exposes the signal terminal 28c to the outside of the multilayer substrate 10 via the cavity h2. The cavity h3 is disposed on the left side of the cavity h1. The cavity h4 is disposed on the right side of the cavity h2. This exposes the top conductive layer 24 to the outside of the multilayer substrate 10 via the cavities h3 and h4. The structure of the cavities h5 through h8 is symmetrical to that of the cavities h1 through h4 with respect to the front-back direction. An explanation of the cavities h5 through h8 will thus be omitted.

The protection layer 20b covers the entirety or substantially the entirety of the bottom main surface of the insulating layer 16c so as to protect the bottom conductive layer 26.

Structure of Electronic Device 1

The structure of an electronic device 1 including the multilayer substrate 10 will be described below with reference to the drawing. FIG. 3 is a left side view of the electronic device 1 including the multilayer substrate 10. The electronic device 1 is a mobile wireless communication terminal, for example. The electronic device 1 is a smartphone, for example.

As illustrated in FIG. 3, the multilayer substrate 10 can be bent. "The multilayer substrate 10 can be bent" means that the multilayer substrate 10 is deformed and bent after being subjected to external force. Hereinafter, a section where the multilayer substrate 10 is bent will be referred to as a bent section A2. Sections where the multilayer substrate 10 is not bent will be referred to as unbent sections A1 and A3. The x axis, y axis, and z axis of the electronic device 1 are defined as follows. The x axis is the front-back direction in the unbent section A1. The y axis is the left-right direction in the unbent section A1. The z axis is the up-down direction in the unbent section A1. The unbent section A1, bent section A2, and unbent section A3 are arranged in this order toward the positive side of the x axis.

As illustrated in FIG. 3, the multilayer substrate 10 is bent in the z-axis direction in the bent section A2. Thus, as shown in FIG. 3, the up-down direction and the front-back direction of the multilayer substrate 10 do not necessarily match the z-axis direction and the x-axis direction, depending on a section of the multilayer substrate 10. In the unbent sections A1 and A3 where the multilayer body 12 is not bent (the position indicated by (1) in FIG. 3, for example), the up-down direction and the front-back direction of the multilayer body 12 match the z-axis direction and the x-axis direction, respectively. In contrast, in the bent section A2 where the multilayer body 12 is bent (the position indicated by (2) in FIG. 3, for example), the up-down direction and the front-back direction of the multilayer body 12 do not match the z-axis direction and the x-axis direction, respectively.

As illustrated in FIG. 3, the electronic device 1 includes the multilayer substrate 10, connectors 30a, 30b, 102a, and 102b, and circuit boards 100 and 110.

The circuit boards 100 and 110 each have a planar shape. The circuit board 100 includes main surfaces S5 and S6. The main surface S5 is positioned farther toward the negative side of the z axis than the main surface S6. The circuit board 110 includes main surfaces S11 and S12. The main surface S11 is positioned farther toward the negative side of the z axis than the main surface S12. The circuit boards 100 and 110 include elements which are not shown, such as wiring conductive layers, ground conductive layers, and electrodes.

The connector 30a is mounted on the main surface (top main surface) of the unbent section A1 on the positive side of the z axis. The connector 30b is mounted on the main surface (top main surface) of the unbent section A3 on the positive side of the z axis. More specifically, the connector 30a is mounted on the signal terminals 28a and 28c and the top conductive layer 24 exposed via the cavities h1 through h4. The connector 30b is mounted on the signal terminals 28b and 28d and the top conductive layer 24 exposed via the cavities h5 through h8.

The connector 102a is mounted on the main surface S5 of the circuit board 100, while the connector 102b is mounted on the main surface S11 of the circuit board 110. The connector 102a is connected to the connector 30a, while the connector 102b is connected to the connector 30b. With the above-described configuration, the multilayer substrate 10 electrically connects the circuit boards 100 and 110 with each other.

Manufacturing Method for Multilayer Substrate 10

Figure 4:
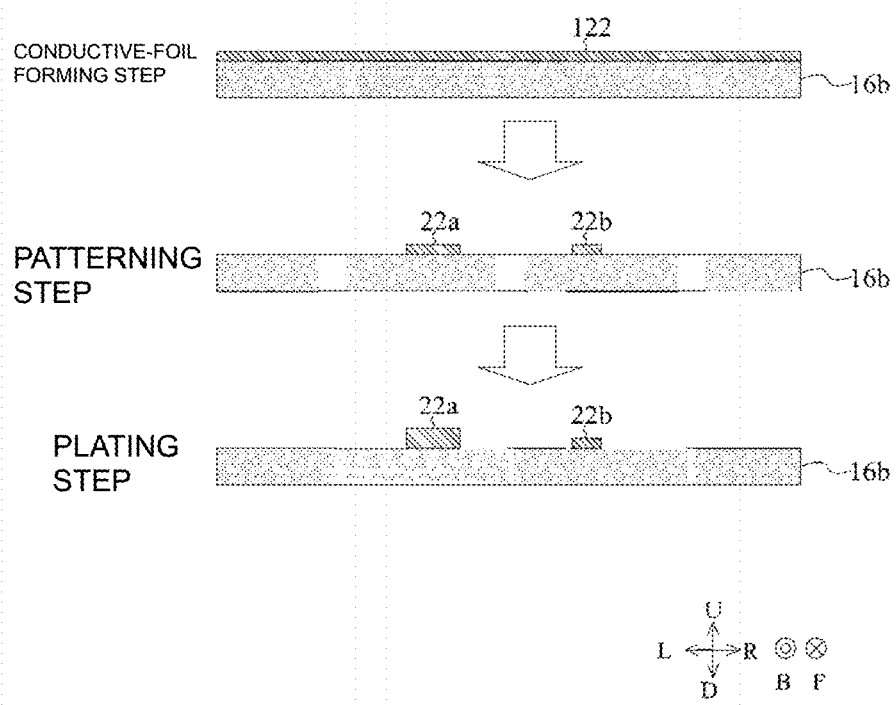
FIG. 4 is a sectional view illustrating that the multilayer substrate 10 is being manufactured.
Figure 5:
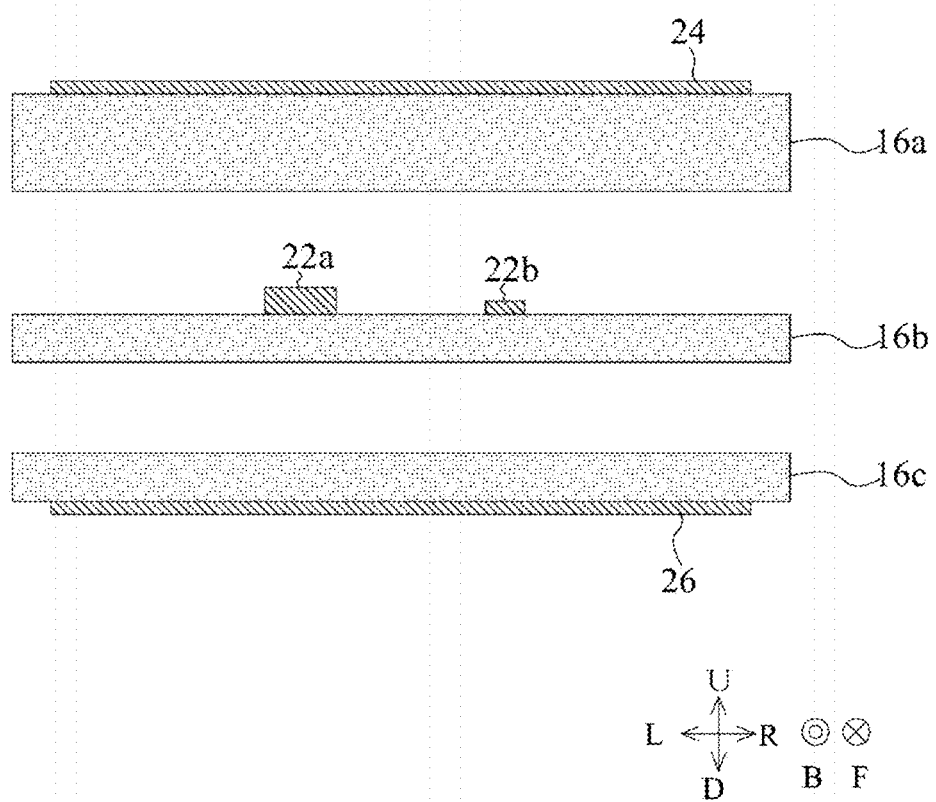
FIG. 5 is a sectional view illustrating that the multilayer substrate 10 is being manufactured.
Figure 6:
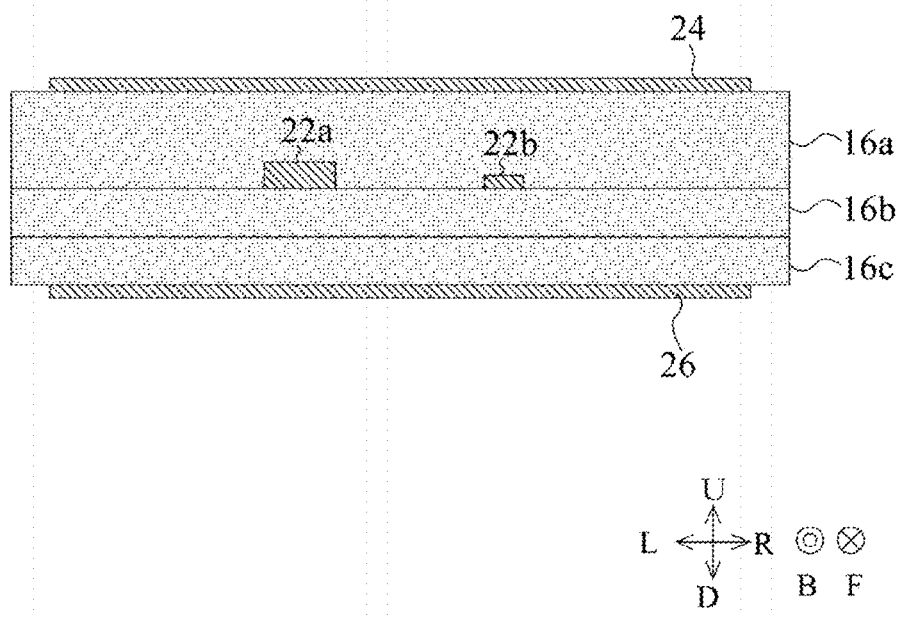
FIG. 6 is a sectional view illustrating that the multilayer substrate 10 is being manufactured.

A non-limiting example of a manufacturing method for the multilayer substrate 10 according to a preferred embodiment of the present invention will be described below with reference to the drawings. FIGS. 4 through 6 are sectional views illustrating that the multilayer substrate 10 is being manufactured.

An insulating layer 16b (third insulating layer) including a first conductive layer 22a and a second conductive layer 22b, whose thicknesses in the up-down direction are different, provided on one of the top main surface and the bottom main surface of the insulating layer 16b is first prepared (preparation step). In the present preferred embodiment, the insulating layer 16b (third insulating layer) including the first conductive layer 22a and the second conductive layer 22b, whose thicknesses in the up-down direction are different, provided on the top main surface of the insulating layer 16b is prepared. More specifically, as illustrated in FIG. 4, a conductive foil is formed on the insulating layer 16b (conductive-foil preparing step). In the present preferred embodiment, a copper foil 122 is cladded to the top main surface of the insulating layer 16b.

Then, a mask (not shown) is positioned at portions where the first conductive layer 22a and the second conductive layer 22b are to be formed, and etching is performed on the copper foil 122 (patterning step). At this stage, as shown in FIG. 4, the thickness Ta of the first conductive layer 22a in the up-down direction and the thickness Tb of the second conductive layer 22b in the up-down direction are equal or substantially equal to each other.

Then, as illustrated in FIG. 4, the first conductive layer 22a (a portion of the conductive foil) is plated so that the thickness Ta of the first conductive layer 22a in the up-down direction becomes larger than the thickness Tb of the second conductive layer 22b in the up-down direction (plating step). More specifically, a mask (not shown) is positioned on the second conductive layer 22b, and then, plating is performed only on the first conductive layer 22a.

Although it is not shown, a conductive foil is formed on the top main surface of the insulating layer 16a and on the bottom main surface of the insulating layer 16c and etching is performed on the conductive foil, thus forming a top conductive layer 24 and a bottom conductive layer 26.

Then, as illustrated in FIG. 5, the insulating layers 16a through 16c including the insulating layer 16b (third insulating layer) are stacked on each other in the up-down direction. Then, as illustrated in FIG. 6, the insulating layers 16a through 16c are heated and pressurized (pressure-bonding step). This softens and fluidizes the insulating layers 16a through 16c made of a thermoplastic resin, thus bonding the insulating layers 16a through 16c with each other. As a result, a multilayer body 12 is formed.

Then, as illustrated in FIG. 1, interlayer connecting conductors v1 through v6 are formed. The interlayer connecting conductors v1 through v6 are formed by making through-holes in the insulating layers 16a through 16c and by plating the through-holes.

At the final stage, a protection layer 20a is formed on the top main surface of the insulating layer 16a by printing, while a protection layer 20b is formed on the bottom main surface of the insulating layer 16c by printing. After the above-described steps, the formation of the multilayer substrate 10 is completed.

Advantages

Using the multilayer substrate 10 can reduce transmission loss occurring in the first conductive layer 22a and the second conductive layer 22b through which signals having different frequencies are transmitted. This will be discussed more specifically. To reduce transmission loss occurring in the first conductive layer 22a and the second conductive layer 22b, for example, the thickness Ta of the first conductive layer 22a in the up-down direction and the thickness Tb of the second conductive layer 22b in the up-down direction may be increased. In this case, the DC resistance of the first conductive layer 22a and that of the second conductive layer 22b can be decreased.

In the multilayer substrate 10, the second signal having a higher frequency than the first signal is transmitted through the second conductive layer 22b. To reduce transmission loss of the second conductive layer 22b, it is necessary that the characteristic impedance of the second conductive layer 22b is close to a predetermined characteristic impedance (about 50Ω, for example). The linewidth of the second conductive layer 22b in the left-right direction and the distance Db between the second conductive layer 22b and the top conductive layer 24 are designed so that the characteristic impedance of the second conductive layer 22b becomes close to the predetermined characteristic impedance. If the thickness Ta of the first conductive layer 22a in the up-down direction and the thickness Tb of the second conductive layer 22b in the up-down direction are increased as described above, the distance Db between the second conductive layer 22b and the top conductive layer 24 in the up-down direction becomes smaller than the design value. The capacitance generated between the second conductive layer 22b and the top conductive layer 24 thus becomes higher than the design value, which makes the characteristic impedance of the second conductive layer 22b deviate from the predetermined characteristic impedance. It is thus difficult to reduce transmission loss occurring in the second conductive layer 22b.

In this manner, when the frequency of the first signal transmitted through the first conductive layer 22a and that of the second signal transmitted through the second conductive layer 22b are different, the condition to reduce the transmission loss of the first conductive layer 22a and that for the second conductive layer 22b become different. It is thus difficult to reduce transmission loss occurring in the first conductive layer 22a and transmission loss occurring in the second conductive layer 22b by increasing the thickness Ta of the first conductive layer 22a in the up-down direction and the thickness Tb of the second conductive layer 22b in the up-down direction.

To address this issue, in the multilayer substrate 10, the thickness Tb of the second conductive layer 22b in the up-down direction is set to be smaller than the thickness Ta of the first conductive layer 22a in the up-down direction. The capacitance generated between the second conductive layer 22b and the top conductive layer 24 is thus less likely to become higher than the design value, which makes it less likely for the characteristic impedance of the second conductive layer 22b to deviate from the predetermined characteristic impedance. Additionally, since the capacitance generated between the second conductive layer 22b and the top conductive layer 24 is less likely to become high, the linewidth of the second conductive layer 22b in the left-right direction can easily be made larger. This makes it possible to increase the length of the outer edge of the second conductive layer 22b in cross section perpendicular or substantially perpendicular to the front-back direction. As a result, when the second signal is transmitted by concentrating on the surface of the second conductive layer 22b due to the skin effect, the area where the second signal can transmit in the second conductive layer 22b is likely to become wider. The transmission loss of the second conductive layer 22b is thus likely to be reduced. In this manner, using the multilayer substrate 10 can reduce transmission loss occurring in the first conductive layer 22a and the second conductive layer 22b through which signals having different frequencies are transmitted.

First Modified Example

Figure 7:
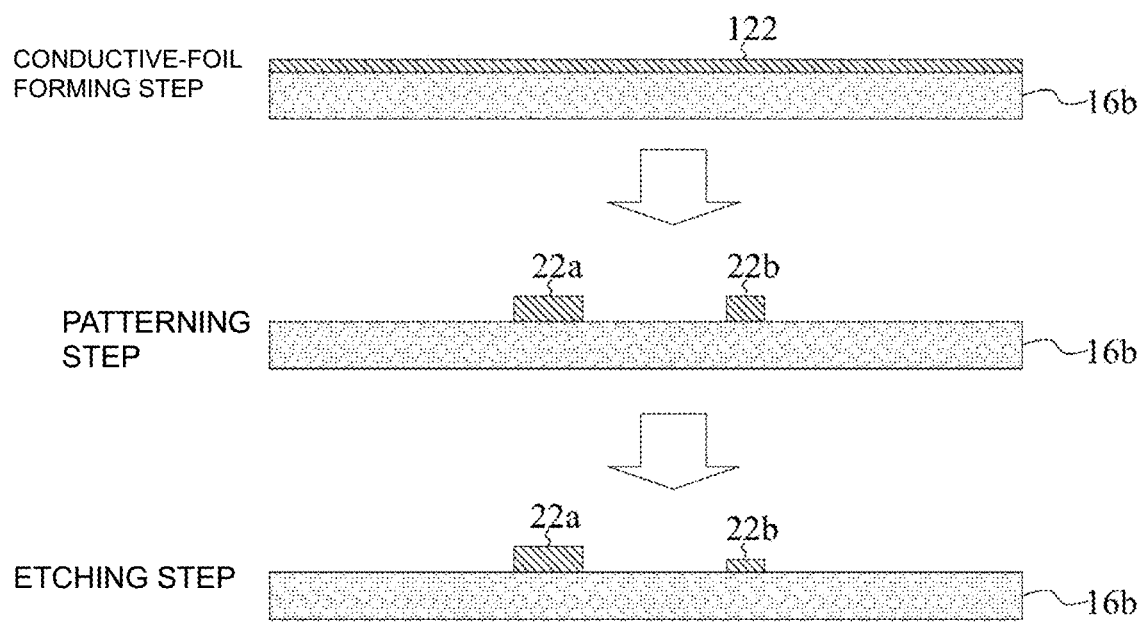
FIG. 7 is a sectional view illustrating that the multilayer substrate 10 is being manufactured.

A manufacturing method for the multilayer substrate 10 according to a first modified example of a preferred embodiment of the present invention will now be described below with reference to the drawings. FIG. 7 is a sectional view illustrating that the multilayer substrate 10 is being manufactured.

The manufacturing method for the multilayer substrate 10 according to the first modified example is different from that for the multilayer substrate 10 of the above-described preferred embodiment in the preparation step. The manufacturing method according to the first modified example will be discussed below in greater detail. As illustrated in FIG. 7, a conductive foil is formed on the insulating layer 16b (third insulating layer) (conductive-foil forming step). In the first modified example, a copper foil 122 is cladded to the top main surface of the insulating layer 16b.

Then, a mask (not shown) is positioned at portions where the first conductive layer 22a and the second conductive layer 22b are to be formed, and etching is performed on the copper foil 122 (patterning step). At this stage, as shown in FIG. 7, the thickness Ta of the first conductive layer 22a in the up-down direction and the thickness Tb of the second conductive layer 22b in the up-down direction are equal or substantially equal to each other.

Then, etching is performed on the second conductive layer 22b (part of the conductive foil) so that the thickness Tb of the second conductive layer 22b in the up-down direction becomes smaller than the thickness Ta of the first conductive layer 22a in the up-down direction (etching step). More specifically, a mask (not shown) is positioned on the first conductive layer 22a, and then, etching is performed only on the second conductive layer 22b. The other steps of the manufacturing method for the multilayer substrate 10 according to the first modified example are the same or substantially the same as those for the multilayer substrate 10 of the present preferred embodiment, and an explanation thereof will thus be omitted. The multilayer substrate 10 can be obtained also by the manufacturing method for the multilayer substrate 10 according to the first modified example.

Second Modified Example

Figure 8:
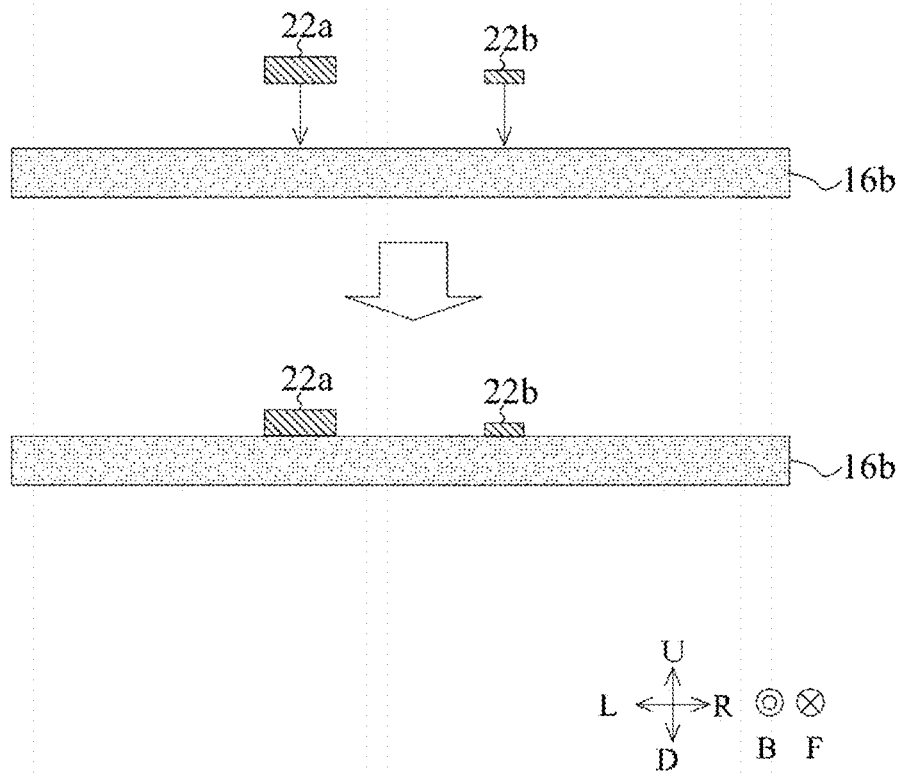
FIG. 8 is a sectional view illustrating that the multilayer substrate 10 is being manufactured.

A manufacturing method for the multilayer substrate 10 according to a second modified example of a preferred embodiment of the present invention will now be described below with reference to the drawings. FIG. 8 is a sectional view illustrating that the multilayer substrate 10 is being manufactured.

The manufacturing method for the multilayer substrate 10 according to the second modified example is different from that for the multilayer substrate 10 of the preferred embodiment in the preparation step. The manufacturing method according to the second modified example will be discussed below in greater detail. As illustrated in FIG. 8, in the preparation step, a first conductive layer 22a and a second conductive layer 22b having different thicknesses in the up-down direction are attached to one of the top main surface and the bottom main surface of the insulating layer 16b (third insulating layer). That is, the first conductive layer 22a and the second conductive layer 22b having different thicknesses are prepared and are then attached to the top main surface of the insulating layer 16b. The other steps of the manufacturing method for the multilayer substrate 10 according to the second modified example are the same or substantially the same as those for the multilayer substrate 10 of the preferred embodiment, and an explanation thereof will thus be omitted. The multilayer substrate 10 can be obtained also by the manufacturing method for the multilayer substrate 10 according to the second modified example.

Third Modified Example

Figure 9:
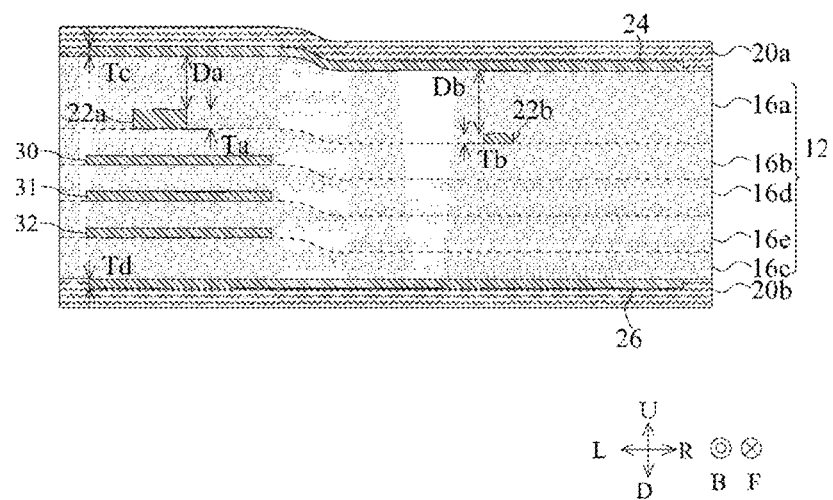
FIG. 9 is a sectional view of a multilayer substrate 10a according to a modified example of a preferred embodiment of the present invention.

A multilayer substrate 10a according to a third modified example of a preferred embodiment of the present invention will now be described below with reference to the drawings. FIG. 9 is a sectional view of the multilayer substrate 10a.

The multilayer substrate 10a is different from the multilayer substrate 10 in that the thickness of the multilayer body 12 in the up-down direction on the left side is different from that of the right side. Hereinafter, this difference will be discussed below.

The multilayer body 12 also includes insulating layers 16d and 16e. The insulating layers 16d and 16e are stacked on each other in the downward direction in this order between the insulating layers 16b and 16c.

The multilayer substrate 10a includes ground conductive layers 30, 31, and 32. The ground conductive layers 30, 31, and 32 are located on the top surfaces of the insulating layers 16d, 16e, and 16c, respectively. Each of the ground conductive layers 30, 31, and 32 overlaps the first conductive layer 22a, as viewed in the up-down direction. None of the ground conductive layers 30, 31, and 32 overlap the second conductive layer 22b, as viewed in the up-down direction. The reason for this is to lower the capacitance generated between the second conductive layer 22b and the ground conductive layers 30, 31, and 32 and thus to reduce or prevent the degradation of the radio-frequency characteristics of the multilayer substrate 10a.

None of the ground conductive layers 30, 31, and 32 overlap the second conductive layer 22b, as viewed in the up-down direction. Accordingly, when the multilayer body 12 is pressure-bonded, the thickness of the left side of the multilayer body 12 in the up-down direction becomes larger than that of the right side of the multilayer body 12 in the up-down direction.

In the multilayer substrate 10a, the distance Da between the first conductive layer 22a and the top conductive layer 24 in the up-down direction is smaller than the distance Db between the second conductive layer 22b and the top conductive layer 24 in the up-down direction.

The structures of the other elements of the multilayer substrate 10a are the same or substantially the same as those of the multilayer substrate 10 and an explanation thereof will thus be omitted. For the same reason as that for the multilayer substrate 10, the multilayer substrate 10a can reduce transmission loss occurring in the first conductive layer 22a and the second conductive layer 22b through which signals having different frequencies are transmitted.

Fourth Modified Example

A multilayer substrate 10b according to a fourth modified example of a preferred embodiment of the present invention will now be described below with reference to the drawings. FIG. 10 is a sectional view of the multilayer substrate 10b.

The multilayer substrate 10b is different from the multilayer substrate 10a in that the boundaries of the insulating layers 16a through 16e are invisible. In the multilayer substrate 10b, the second conductive layer 22b overlaps the first conductive layer 22a in a direction perpendicular or substantially perpendicular to the transmitting direction of the first signal.

The structures of the other elements of the multilayer substrate 10b are the same or substantially the same as those of the multilayer substrate 10a and an explanation thereof will thus be omitted. For the same reason as that for the multilayer substrate 10a, the multilayer substrate 10b can reduce transmission loss occurring in the first conductive layer 22a and the second conductive layer 22b through which signals having different frequencies are transmitted.

Fifth Modified Example

Structure of Multilayer Substrate 10c

A multilayer substrate 10c according to a fifth modified example of a preferred embodiment of the present invention will now be described below with reference to the drawings. FIG. 11 is a sectional view of the multilayer substrate 10c.

The multilayer substrate 10c is different from the multilayer substrate 10 in that it includes an insulating layer 18 instead of the insulating layer 16c and the bottom conductive layer 26 is disposed on the bottom main surface of the insulating layer 16b. The multilayer substrate 10c will be explained below mainly by referring to these differences.

The multilayer body 12 includes an insulating layer 16a (first insulating layer), an insulating layer 16b (third insulating layer), and an insulating layer 18 (second insulating layer). The insulating layer 16a (first insulating layer) and the insulating layer 18 (second insulating layer) are positioned below the top conductive layer 24 and above the first insulating layer 22a and the second insulating layer 22b and are stacked adjacent to each other in the downward direction in this order. The insulating layer 16b is provided below the insulating layer 18. The boundary between the insulating layers 16a and 18 is located at a midpoint between the bottom main surface of the top conductive layer 24 and the bottom main surfaces of the first and second conductive layers 22a and 22b. The material for the insulating layer 16b (third insulating layer) is the same as that for the insulating layer 16a (first insulating layer). "The material is the same" means that manufacturing variations are allowed. The material for the insulating layer 18 is different from that for the insulating layers 16a and 16b. The insulating layer 18 (second insulating layer) defines and functions as a bonding layer for bonding the insulating layer 16a (first insulating layer) and the insulating layer 16b (third insulating layer) with each other. The dielectric constant of the insulating layer 18 (second insulating layer) is lower than that of the insulating layer 16a (first insulating layer). The dissipation factor of the insulating layer 18 (second insulating layer) is lower than that of the insulating layer 16. The material for the insulating layer 18 that satisfies the above-described conditions is fluorine resin, for example. The material for the insulating layer 18 may alternatively be another type of resin, such as epoxy resin or acrylic resin, for example.

The first conductive layer 22a and the second conductive layer 22b are disposed on the insulating layer 16b (third insulating layer). In the present preferred embodiment, the first conductive layer 22a and the second conductive layer 22b are disposed on the top main surface of the insulating layer 16b (third insulating layer). The top conductive layer 24 is disposed on the insulating layer 16a (first insulating layer). In the present preferred embodiment, the top conductive layer 24 is disposed on the top main surface of the insulating layer 16a (first insulating layer). The bottom conductive layer 26 is disposed on the bottom main surface of the insulating layer 16b (third insulating layer). The structures of the other elements of the multilayer substrate 10c are the same or substantially the same as those of the multilayer substrate 10 and an explanation thereof will thus be omitted.

Manufacturing Method for Multilayer Substrate 10c

Figure 12:
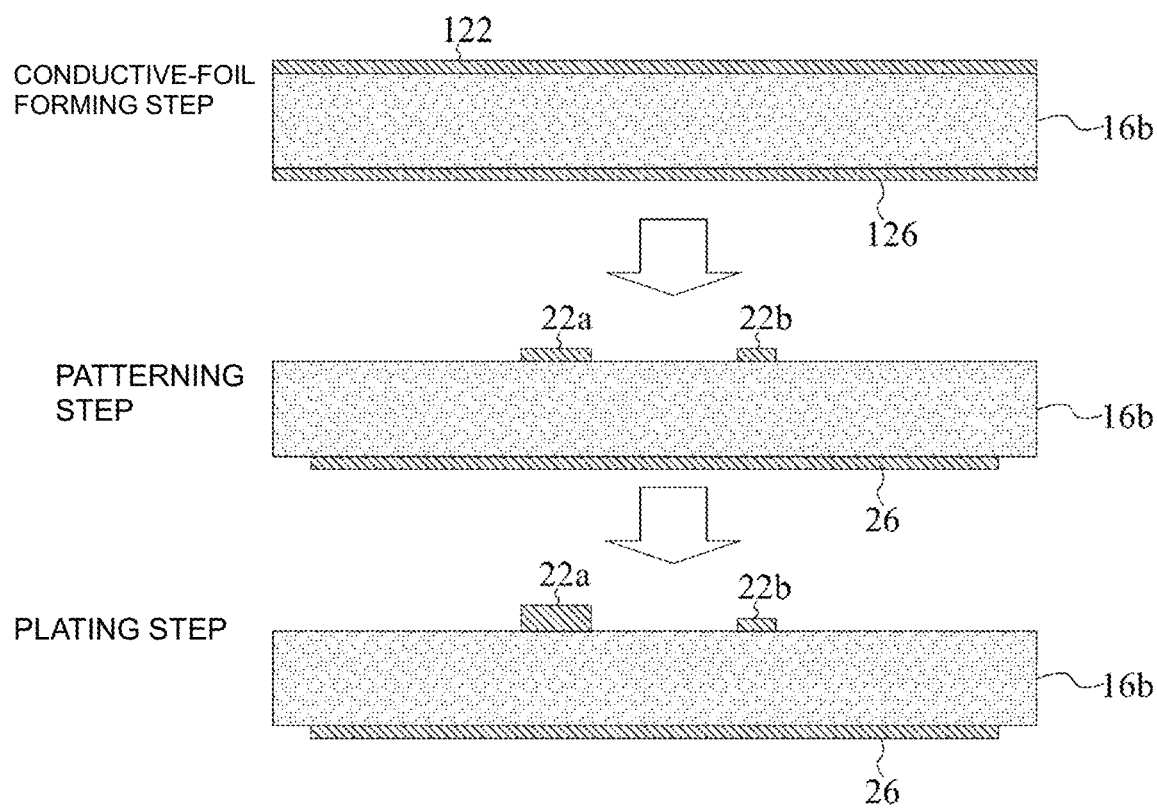
FIG. 12 is a sectional view illustrating that the multilayer substrate 10c is being manufactured.
Figure 13:
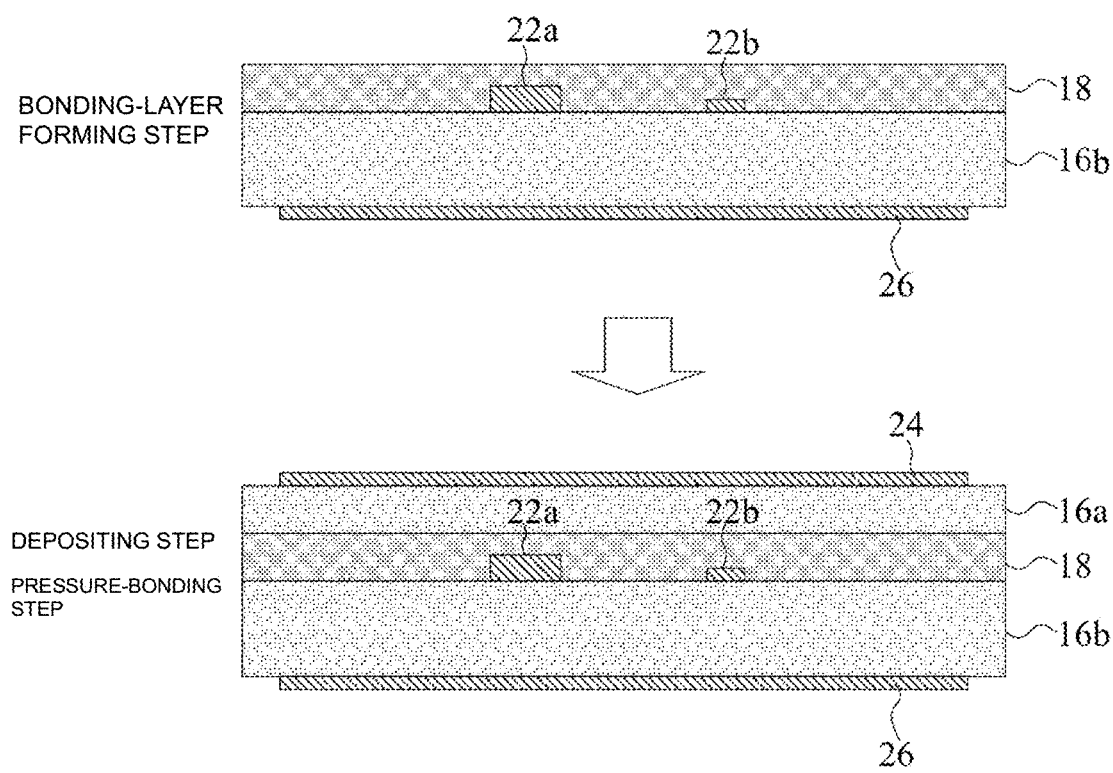
FIG. 13 is a sectional view illustrating that the multilayer substrate 10c is being manufactured.

A non-limiting example of a manufacturing method for the multilayer substrate 10c will be described below with reference to the drawings. FIGS. 12 and 13 are sectional views illustrating that the multilayer substrate 10c is being manufactured.

An insulating layer 16b (third insulating layer) including a first conductive layer 22a and a second conductive layer 22b, whose thicknesses in the up-down direction are different, provided on one of the top main surface and the bottom main surface of the insulating layer 16b is first prepared (preparation step). In the fifth modified example, the insulating layer 16b (third insulating layer) including the first conductive layer 22a and the second conductive layer 22b, whose thicknesses in the up-down direction are different, provided on the top main surface of the insulating layer 16b is prepared. More specifically, as illustrated in FIG. 12, a conductive foil is formed on the insulating layer 16b (conductive-foil preparing step). In the preferred embodiment, copper foils 122 and 126 are cladded to the top main surface and the bottom main surface, respectively, of the insulating layer 16b.

Then, a mask (not shown) is positioned at portions where the first conductive layer 22a and the second conductive layer 22b are to be formed, and etching is performed on the copper foil 122. Similarly, a mask (not shown) is positioned at a portion where the bottom conductive layer 26 is to be formed, and etching is performed on the copper foil 126. At this stage, as shown in FIG. 12, the thickness Ta of the first conductive layer 22a in the up-down direction and the thickness Tb of the second conductive layer 22b in the up-down direction are equal or substantially equal to each other. Etching on the copper foil 122 and that on the copper foil 126 may be performed at the same time.

Then, as illustrated in FIG. 12, the first conductive layer 22a (a portion of the conductive foil) is plated so that the thickness Ta of the first conductive layer 22a in the up-down direction becomes larger than the thickness Tb of the second conductive layer 22b in the up-down direction (plating step). More specifically, a mask (not shown) is positioned on the second conductive layer 22b and the bottom conductive layer 26, and then, plating is performed only on the first conductive layer 22a.

Although it is not shown, a conductive foil is formed on the top main surface of the insulating layer 16a and etching is performed on the conductive foil, thus forming a top conductive layer 24.

Then, the insulating layer 16a (first insulating layer), the insulating layer 18 (second insulating layer), which is a bonding layer without a conductive layer, and the insulating layer 16b (third insulating layer) are arranged in the downward direction in this order and are stacked on each other. More specifically, an insulating layer 18, which defines and functions as a bonding layer, is formed on the top main surface of the insulating layer 16b (bonding-layer forming step). In the bonding-layer forming step, for example, a liquid resin is applied to the top main surface of the insulating layer 16b. The insulating layer 16a is then deposited on the insulating layer 18 (depositing step). Then, the insulating layer 16a (first insulating layer), insulating layer 16b (third insulating layer), and insulating layer 18 (bonding layer) are heated and pressurized (pressure-bonding step). With this step, the insulating layer 18 defines and functions as a bonding layer so as to bond the insulating layers 16a and 16b with each other. If another insulating layer is stacked on the insulating layer 16a, the bonding-layer forming step, depositing step, and pressure-bonding step are repeated.

Then, as illustrated in FIG. 11, interlayer connecting conductors v1 through v6 are formed. The interlayer connecting conductors v1 through v6 are formed by making through-holes in the insulating layers 16a, 18 and 16b and by plating the through-holes.

At the final stage, a protection layer 20a is formed on the top main surface of the insulating layer 16a by printing, while a protection layer 20b is formed on the bottom main surface of the insulating layer 16b by printing. After the above-described steps, the formation of the multilayer substrate 10c is completed.

Advantages

For the same or substantially the same reasons as those for the multilayer substrate 10, using the multilayer substrate 10c can reduce transmission loss occurring in the first conductive layer 22a and the second conductive layer 22b through which signals having different frequencies are transmitted.

Using the multilayer substrate 10c can more effectively reduce the transmission loss of the second conductive layer 22b. This will be explained more specifically. The insulating layers 16a and 18 are located below the top conductive layer 24 and above the first conductive layer 22a and the second conductive layer 22b and are stacked adjacent to each other in the downward direction in this order. The dielectric constant of the insulating layer 18 is lower than that of the insulating layer 16a. The dissipation factor of the insulating layer 18 is lower than that of the insulating layer 16a. With this configuration, the dielectric constant and the dissipation factor of the vicinity of the second conductive layer 22b become low. This reduces the occurrence of dielectric loss in the second conductive layer 22b when the second signal, which is a radio-frequency signal, is transmitted through the second conductive layer 22b. It is thus possible to more effectively reduce the transmission loss of the second conductive layer 22b in the multilayer substrate 10c.

In the multilayer substrate 10c, as the material for the insulating layers 16a and 16b, a thermoplastic resin may be used, or another material may be used.

Sixth Modified Example

A multilayer substrate 10d according to a sixth modified example of a preferred embodiment of the present invention will be described below with reference to the drawings. FIG. 14 is a sectional view of the multilayer substrate 10d.

The multilayer substrate 10d is different from the multilayer substrate 10 in that it also includes ground conductive layers 27a and 27b. The ground conductive layers 27a and 27b are connected to a ground potential. The ground conductive layers 27a and 27b are disposed on the top main surface of the insulating layer 16b. The ground conductive layer 27a is disposed between the first conductive layer 22a and the second conductive layer 22b. The ground conductive layer 27b is disposed on the right side of the second conductive layer 22b. The structures of the other elements of the multilayer substrate 10d are the same or substantially the same as those of the multilayer substrate 10 and an explanation thereof will thus be omitted.

For the same or substantially the same reasons as those for the multilayer substrate 10, the multilayer substrate 10d can reduce transmission loss occurring in the first conductive layer 22a and the second conductive layer 22b through which signals having different frequencies are transmitted.

In the multilayer substrate 10d, the ground conductive layer 27a is disposed between the first conductive layer 22a and the second conductive layer 22b. This improves the isolation between the first conductive layer 22a and the second conductive layer 22b.

In the multilayer substrate 10d, the ground conductive layers 27a and 27b may be electrically connected to at least one of the top conductive layer 24 and the bottom conductive layer 26 by using an interlayer connecting conductor. This can stabilize the potential of the ground conductive layers 27a and 27b at a ground potential.

Seventh Modified Example

A multilayer substrate 10e according to a seventh modified example of a preferred embodiment of the present invention will be described below with reference to the drawings. FIG. 15 is a sectional view of the multilayer substrate 10e.

The multilayer substrate 10e is different from the multilayer substrate 10c in that it also includes ground conductive layers 27a and 27b. The ground conductive layers 27a and 27b are connected to a ground potential. The ground conductive layers 27a and 27b are disposed on the top main surface of the insulating layer 16b. The ground conductive layer 27a is disposed between the first conductive layer 22a and the second conductive layer 22b. The ground conductive layer 27b is disposed on the right side of the second conductive layer 22b. The structures of the other elements of the multilayer substrate 10e are the same or substantially the same as those of the multilayer substrate 10c and an explanation thereof will thus be omitted.

For the same or substantially the same reasons as those for the multilayer substrate 10c, the multilayer substrate 10e can reduce transmission loss occurring in the first conductive layer 22a and the second conductive layer 22b through which signals having different frequencies are transmitted.

In the multilayer substrate 10e, the ground conductive layer 27a is disposed between the first conductive layer 22a and the second conductive layer 22b. This improves the isolation between the first conductive layer 22a and the second conductive layer 22b.

OTHER PREFERRED EMBODIMENTS

The multilayer substrates according to preferred embodiments of the present invention are not restricted to the multilayer substrates 10 and 10a through 10e. The multilayer substrates 10 and 10a through 10e may be modified within the scope and spirit of the present invention. The configurations of the multilayer substrates 10 and 10a through 10e may be combined in a desired manner.

The insulating layers 16a through 16c may have a structure in which glass cloth is impregnated with epoxy resin. In this case, the multilayer substrates 10 and 10a through 10e do not have flexibility.

In the multilayer substrates 10 and 10a through 10e, the bottom conductive layer 26 is not necessary. In this case, the first conductive layer 22a and the top conductive layer 24 define a microstrip line structure. Similarly, the second conductive layer 22b and the top conductive layer 24 define a microstrip line structure.

In the multilayer substrates 10 and 10a through 10e, the interlayer connecting conductors v1 and v2 is not necessary.

The multilayer substrates 10 and 10a through 10e are transmission lines. However, the multilayer substrates 10 and 10a through 10e may be circuit boards. Thus, the multilayer substrates 10 and 10a through 10e may include another circuit in addition to a stripline.

In the multilayer substrates 10 and 10a through 10e, the signal terminals 28a through 28d may be provided on the bottom surface of the multilayer body 12.

An electronic component other than the connectors 30a and 30b may be mounted on the multilayer substrates 10 and 10a through 10e.

The multilayer substrates 10 and 10a through 10e have a linear shape as viewed in the up-down direction. Alternatively, the multilayer substrates 10 and 10a through 10e may be curved. "The multilayer substrates 10 and 10a through 10e are curved" means that the multilayer substrates 10 and 10a through 10e have a curved shape without being subjected to external force.

It is not necessary that the first conductive layer 22a and the second conductive layer 22b extend parallel or substantially parallel with each other.

The insulating layer 18 may be formed by attaching a resin sheet to the top main surface of the insulating layer 16b.

The dielectric constant of the insulating layer 18 may be higher than or equal to that of the insulating layer 16a, and the dissipation factor of the insulating layer 18 may be lower than that of the insulating layer 16a. Alternatively, the dielectric constant of the insulating layer 18 may be lower than that of the insulating layer 16a, and the dissipation factor of the insulating layer 18 may be higher than or equal to that of the insulating layer 16a. Alternatively, the dielectric constant of the insulating layer 18 may be higher than or equal to that of the insulating layer 16a, and the dissipation factor of the insulating layer 18 may be higher than or equal to that of the insulating layer 16a.

In the manufacturing method for the multilayer substrate 10 according to the preferred embodiment and the manufacturing method for the multilayer substrate 10c according to the fifth modified example, the patterning step may be performed after the plating step.

In the manufacturing method for the multilayer substrate 10 according to the first modified example, the patterning step may be performed after the etching step.

The top conductive layer 24 and the bottom conductive layer 26 may be connected to a potential other than a ground potential.

It is not necessary that the top conductive layer 24 overlaps the first conductive layer 22a as viewed in the up-down direction.

It is not necessary that the bottom conductive layer 26 overlaps the first conductive layer 22a as viewed in the up-down direction.

In the multilayer substrate 10a, the second conductive layer 22b may overlap the first conductive layer 22a in a direction perpendicular or substantially perpendicular to the transmitting direction of the first signal.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A multilayer substrate comprising:
    a multilayer body including a plurality of insulating layers stacked on each other in an up-down direction;
    a first conductive layer on one of a top main surface or a bottom main surface of one of the plurality of insulating layers, a first signal being transmitted through the first conductive layer;
    a second conductive layer on the one of the top main surface or a bottom main surface of the one of the plurality of insulating layers, a second signal having a higher frequency than the first signal being transmitted through the second conductive layer; and
    a top conductive layer on the multilayer body and provided above the first and second conductive layers so as to overlap the second conductive layer as viewed in the up-down direction; wherein
    a thickness of the second conductive layer in the up-down direction is smaller than a thickness of the first conductive layer in the up-down direction;
    the top conductive layer is closer to the first conductive layer and the second conductive layer than any other conductive layers in the up-down direction; and
    a distance between the second conductive layer and the top conductive layer in the up-down direction is larger than a distance between the first conductive layer and the top conductive layer in the up-down direction.

2. The multilayer substrate according to claim 1, wherein the plurality of insulating layers include first and second insulating layers;
    the first insulating layer and the second insulating layer are provided below the top conductive layer and above the first and second conductive layers and are stacked adjacent to each other from an upward to a downward direction in order of the first insulating layer and the second insulating layer; and
    a dissipation factor of the second insulating layer is lower than a dissipation factor of the first insulating layer.

3. The multilayer substrate according to claim 1, wherein the plurality of insulating layers include first and second insulating layers;
    the first insulating layer and the second insulating layer are provided below the top conductive layer and above the first and second conductive layers and are stacked adjacent to each other from an upward to a downward direction in order of the first insulating layer and the second insulating layer; and
    a dielectric constant of the second insulating layer is lower than a dielectric constant of the first insulating layer.

4. The multilayer substrate according to claim 3, wherein the plurality of insulating layers further include a third insulating layer;
    the first and second conductive layers are provided on the third insulating layer;
    a material of the third insulating layer is the same as a material of the first insulating layer; and
    the second insulating layer defines and functions as a bonding layer to bond the first insulating layer and the third insulating layer with each other.

5. The multilayer substrate according to claim 1, wherein both of the first conductive layer and the second conductive layer are located between a same pair of the plurality of insulating layers.

6. The multilayer substrate according to claim 1, further comprising a bottom conductive layer on the multilayer body and provided below the first and second conductive layers so as to overlap the second conductive layer as viewed in the up-down direction.

7. The multilayer substrate according to claim 1, further comprising a ground conductive layer between the first conductive layer and the second conductive layer.

8. The multilayer substrate according to claim 1, wherein the first signal is a direct current signal which defines and functions as a power supply.

9. The multilayer substrate according to claim 1, wherein the top conductive layer is a ground conductive layer.

10. A multilayer substrate comprising:
 a multilayer body including a plurality of insulating layers stacked on each other in an up-down direction;
 a first conductive layer on one of a top main surface or a bottom main surface of one of the plurality of insulating layers, a first signal being transmitted through the first conductive layer;
 a second conductive layer on the one of the top main surface or a bottom main surface of the one of the plurality of insulating layers, a second signal having a higher frequency than the first signal being transmitted through the second conductive layer; and
 a top conductive layer on the multilayer body and provided above the first and second conductive layers so as to overlap the second conductive layer as viewed in the up-down direction; wherein
 a thickness of the second conductive layer in the up-down direction is smaller than a thickness of the first conductive layer in the up-down direction;
 the top conductive layer is closer to the first conductive layer and the second conductive layer than any other conductive layers in the up-down direction; and
 the top conductive layer overlaps the first conductive layer and the second conductive layer as viewed in the up-down direction.

11. The multilayer substrate according to claim 10, wherein
 the plurality of insulating layers include first and second insulating layers;
 the first insulating layer and the second insulating layer are provided below the top conductive layer and above the first and second conductive layers and are stacked adjacent to each other from an upward to a downward direction in order of the first insulating layer and the second insulating layer; and
 a dielectric constant of the second insulating layer is lower than a dielectric constant of the first insulating layer.

12. The multilayer substrate according to claim 11, wherein
 the plurality of insulating layers further include a third insulating layer;
 the first and second conductive layers are provided on the third insulating layer;
 a material of the third insulating layer is the same as a material of the first insulating layer; and
 the second insulating layer defines and functions as a bonding layer to bond the first insulating layer and the third insulating layer with each other.

13. The multilayer substrate according to claim 10, wherein
 the plurality of insulating layers include first and second insulating layers;
 the first insulating layer and the second insulating layer are provided below the top conductive layer and above the first and second conductive layers and are stacked adjacent to each other from an upward to a downward direction in order of the first insulating layer and the second insulating layer; and
 a dissipation factor of the second insulating layer is lower than a dissipation factor of the first insulating layer.

14. The multilayer substrate according to claim 10, further comprising a bottom conductive layer on the multilayer body and provided below the first and second conductive layers so as to overlap the second conductive layer as viewed in the up-down direction.

15. The multilayer substrate according to claim 10, further comprising a ground conductive layer between the first conductive layer and the second conductive layer.

16. The multilayer substrate according to claim 10, wherein the first signal is a direct current signal which defines and functions as a power supply.

17. The multilayer substrate according to claim 10, wherein the top conductive layer is a ground conductive layer.

18. The multilayer substrate according to claim 10, wherein both of the first conductive layer and the second conductive layer are located between a same pair of the plurality of insulating layers.

19. A multilayer substrate comprising:
 a main body including an insulating material;
 a first conductive layer in or on the main body, a first signal being transmitted through the first conductive layer;
 a second conductive layer in or on the main body, a second signal having a higher frequency than the first signal being transmitted through the second conductive layer; and
 a top conductive layer in or on the main body and provided above the first and second conductive layers so as to overlap the second conductive layer as viewed in the up-down direction; wherein
 the second conductive layer overlaps the first conductive layer in a direction perpendicular or substantially perpendicular to a transmitting direction of the first signal;
 a thickness of the second conductive layer in the up-down direction is smaller than a thickness of the first conductive layer in the up-down direction;
 the top conductive layer is closer to the first conductive layer and the second conductive layer than any other conductive layers in the up-down direction; and
 a distance between the second conductive layer and the top conductive layer in the up-down direction is larger than a distance between the first conductive layer and the top conductive layer in the up-down direction.

20. A multilayer substrate comprising:
 a main body including an insulating material;
 a first conductive layer in or on the main body, a first signal being transmitted through the first conductive layer;
 a second conductive layer in or on the main body, a second signal having a higher frequency than the first signal being transmitted through the second conductive layer; and
 a top conductive layer in or on the main body and provided above the first and second conductive layers so as to overlap the second conductive layer as viewed in the up-down direction; wherein the second conductive layer overlaps the first conductive layer in a direction perpendicular or substantially perpendicular to a transmitting direction of the first signal;

a thickness of the second conductive layer in the up-down direction is smaller than a thickness of the first conductive layer in the up-down direction;

the top conductive layer is closer to the first conductive layer and the second conductive layer than any other conductive layers in the up-down direction; and the top conductive layer overlaps the first conductive layer and the second conductive layer as viewed in the up-down direction.

* * * * *